(12) United States Patent
Ikeda et al.

(10) Patent No.: US 6,507,026 B2
(45) Date of Patent: Jan. 14, 2003

(54) PLANAR X-RAY DETECTOR

(75) Inventors: Mitsushi Ikeda, Yokohama (JP); Masaki Atsuta, Yokosuka (JP); Akira Kinno, Yokohama (JP); Manabu Tanaka, Otawara (JP); Yasuhiro Sugawara, Otawara (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/756,773

(22) Filed: Jan. 10, 2001

(65) Prior Publication Data

US 2001/0008271 A1 Jul. 19, 2001

(30) Foreign Application Priority Data

Jan. 12, 2000 (JP) ........................................ 2000-006306

(51) Int. Cl.[7] .................................................. G01T 1/24
(52) U.S. Cl. .............................. 250/370.09; 250/370.12
(58) Field of Search ....................... 250/370.09, 370.08, 250/370.12, 370.14; 257/428

(56) References Cited

U.S. PATENT DOCUMENTS

| 4,886,719 | A | * | 12/1989 | Tanaka et al. ................. 430/58 |
| 5,198,673 | A | * | 3/1993 | Rougeot et al. ........ 250/370.11 |
| 5,391,882 | A | * | 2/1995 | Rhiger ................... 250/370.13 |
| 5,498,880 | A | * | 3/1996 | Lee et al. .................... 250/580 |
| 5,874,197 | A | * | 2/1999 | Felten ...................... 430/281.1 |
| 5,886,359 | A | * | 3/1999 | Bringley et al. ............. 250/580 |
| 5,925,890 | A | * | 7/1999 | Van den Bogaert et al. 250/580 |

FOREIGN PATENT DOCUMENTS

| JP | 3-273687 | 12/1991 |
| JP | 4-063555 | 10/1992 |

* cited by examiner

Primary Examiner—Constantine Hannaher
Assistant Examiner—Timothy J. Moran
(74) Attorney, Agent, or Firm—Oblon, Spivak, McClelland, Maier & Neustadt, P.C.

(57) ABSTRACT

A planar X-ray detector has an X-ray charge conversion film converting an incident X-ray into electric charges, pixel electrodes provided on the X-ray charge conversion film corresponding to respective pixels arranged in an array, switching elements connected to the respective pixel electrodes, signal lines, each of which is connected to a column of switching elements, scanning lines, each of which transmits driving signals to a row of switching elements, and a common electrode provided on the surface of the X-ray charge conversion film opposite to the surface on which the pixel electrodes are provided. The X-ray charge conversion film contains an X-ray sensitive material made of inorganic-semiconductor particles, and a carrier transport material made of an organic semiconductor.

12 Claims, 4 Drawing Sheets

PLANAR X-RAY DETECTOR

CROSS-REFERENCE TO RELATED APPLICATIONS

This application is based upon and claims the benefit of priority from the prior Japanese Patent Application No. 2000-006306, filed Jan. 12, 2000, the entire contents of which are incorporated herein by reference.

BACKGROUND OF THE INVENTION

The present invention relates to a planar X-ray detector for a medical X-ray diagnostic apparatus.

In recent years, in the medical field, database are being prepared with respect to the medical data of patients in order to perform medical treatments promptly and exactly. This is because, since a patient often utilizes two or more medical institutions, a medical institution requires the data on the patient prepared in another medical institution in order to perform an exact medical treatment.

There are also demands for preparing database on image data of the radiographs, and therefore it is requested to digitize the radiograph images in accordance with the demands. In the medical X-ray diagnostic apparatus, it has been customary to photograph an image using a silver halide film. In order to digitize such an image, it is necessary to develop the photographed image, followed by reading the image with a scanner or the like, leading to requirement of much labor and time.

Recently, an image intensifier TV system of directly detecting a digital image by using a photoelectron emission film, a vacuum tube, a phosphor film, and a CCD camera of a size of about one inch has been realized. However, in the diagnosis of, for example, lungs, a large area of about 40 cm×40 cm is photographed, making it necessary to use an optical apparatus for converging light. As a result, a large volume size of the apparatus becomes a serious problem.

As a system capable of solving the problems inherent in the above two systems, proposed is a planar X-ray detector of a direct conversion type using an amorphous silicon thin film transistor (a-Si TFT). In the planar X-ray detector, an incident X-ray is directly converted into electric charges by an X-ray charge conversion film in each pixel.

FIG. 1 shows the element structure of one pixel of the conventional planar X-ray detector. A capacitor (Cst) of a laminate structure consisting of a capacitor electrode 404, an insulating layer 103 and an auxiliary electrode 502, and a switching TFT 402 and a protective TFT 411, each of which is connected to the capacitor, are formed on a glass substrate 101. A passivation film is formed on these members, having a contact hole. Formed on the passivation film is a laminate structure consisting of a pixel electrode 503, which is connected to the auxiliary electrode 502, a p-type contact film 601, an X-ray charge conversion film 403, an n-type contact film 602, and a common electrode 603. The pixels are arranged to form an array.

When an X-ray is incident on the planar X-ray detector, the X-ray is converted into electric charges by the X-ray charge conversion film 403, and the electric charges are accelerated by an electric field applied between the common electrode 603 and the pixel electrode 503 and then accumulated in the capacitor. The switching TFT 402 is driven through a scanning line so as to transport the charges accumulated in the capacitor to a signal line and to an amplifier circuit 410. The protective TFT 411 functions to release charges when excessive charges are generated.

Conventionally, a film of Se, $PbI_2$ or the like is mainly used as the X-ray charge conversion film 403. On the surface of the planar X-ray detector, the X-ray charge conversion film 403 is covered with the n-type contact film 602 and the common electrode 603. However, the X-ray charge conversion film 403 is exposed to the outside in the side surface of the planar X-ray detector. Since the material such as Se and $PbI_2$ gives a detrimental effect to the human body, it is undesirable for the X-ray charge conversion film 403 to be exposed to the outside. Also, in order to obtain a high-precision image, it is necessary to form the X-ray charge conversion film 403 uniformly. However, it is difficult to form a large area uniform film by using a metal or a metal compound such as Se and $PbI_2$.

Japanese Patent Publication (Kokoku) No. 4-63555 discloses an X-ray sensor comprising an X-ray detecting layer formed of phosphor particles and photoconductor particles dispersed in the transparent charge transport material. The X-ray sensor is applied to an X-ray CT scanner. In the X-ray sensor, the phosphor particles irradiated with the X-ray emits fluorescent light, and the photoconductor particles irradiated with the fluorescent light generates electrons and holes, which are transported by the charge transport material. However, where the X-ray sensor is applied to a planar X-ray detector, a problem is brought about that the generated fluorescent light spreads in an isotropic manner and arrives at adjacent pixels so as to bring about crosstalk and deterioration of spatial resolution of detected image.

Japanese Patent Disclosure (Kokai) No. 3-273687 discloses a radiation absorbing material prepared by dispersing in an organic semiconductor such as metal phthalocyanine or an inorganic semiconductor of such as CdS, a metal of such as W or Pb element having an atomic number larger than that of the basal organic semiconductor or inorganic semiconductor. However, since the prior art uses a metal as the radiation absorbing material, electron-hole pairs have high probability to recombine within the metal, because there exists a large Coulombic attractive force between small distance electron-hole pair due to small velocity caused by small electric field in metal having a high conductivity, making it difficult to take out the charges to the outside, and leading to poor efficiency.

BRIEF SUMMARY OF THE INVENTION

An object of the present invention is to provide a planar X-ray detector that enables to effectively take out charges generated by an incident X-ray to the outside.

According to an aspect of the present invention, there is provided a planar X-ray detector, comprising: a pair of electrodes, and an X-ray charge conversion film disposed between the electrodes, the film containing a mixture of inorganic semiconductor particles sensitive to an X-ray and a carrier transport material.

According to another aspect of the present invention, there is provided a planar X-ray detector, comprising: an X-ray charge conversion film converting an incident X-ray into electric charges; pixel electrodes provided on the X-ray charge conversion film corresponding to respective pixels arranged in an array; switching elements connected to the respective pixel electrodes; signal lines, each of which is connected to a column of switching elements; scanning lines, each of which transmits driving signals to a raw of switching elements; and a common electrode provided on the surface of the X-ray charge conversion film opposite to the surface on which the pixel electrodes are provided, wherein the X-ray charge conversion film contains an X-ray sensitive material comprising inorganic semiconductor particles, and a carrier transport material comprising an organic semiconductor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

DETAILED DESCRIPTION OF THE INVENTION

Figure 1:
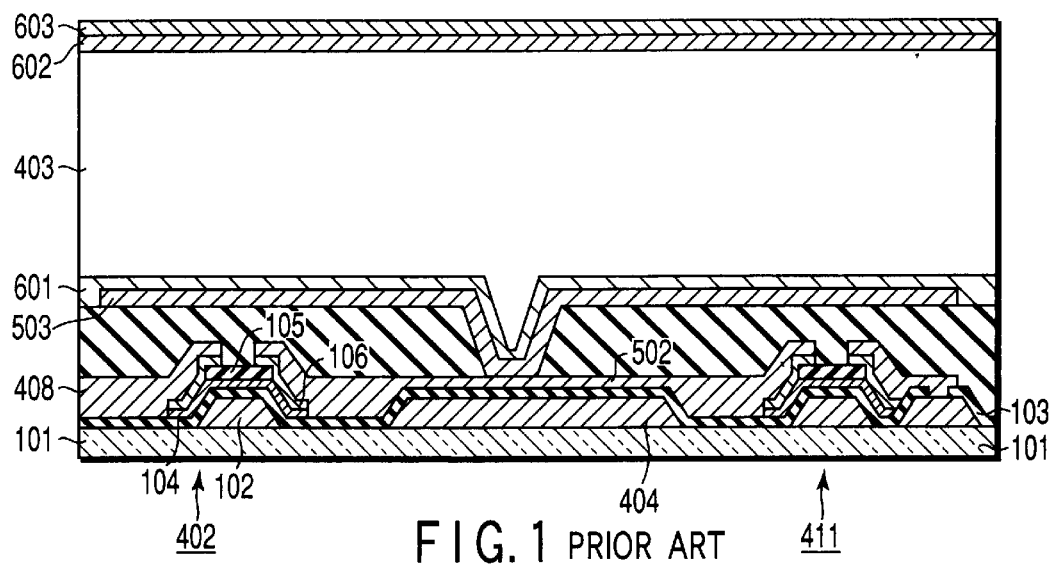
FIG. 1 is a cross sectional view showing a conventional planar X-ray detector.

An X-ray sensitive material of the embodiment of the present invention is formed of inorganic semiconductor particles sensitive to an X-ray. The inorganic semiconductor used as the X-ray sensitive material is made of at least one material selected from the group consisting of $PbI_2$, CsI, NaI, $HgI_2$, CdS, $Hg_2IN$, HgBrN, $Mn_3HgN$, $HgI_2BN$, $PbN_2$, $Pb(N_3)_2$, GaAs, CdTe, PbTe, Te and Se. These materials have a high absorption coefficient of X-ray and, thus, are used preferably. The particle size of the X-ray sensitive material particles is set to, for example, a range of between about 1 µm and 10 µm.

A carrier transport material is made of an organic semiconductor having conductivity. It is desirable for the mobility of the hole or electron of the transport material to be at least about $1 \times 10^{-7}$ cm$^2$/V·sec. The organic semiconductor used as the carrier transport material is made of at least one material selected from the group consisting of tris(8-quinolinolato)aluminum ($Alq_3$), N,N-diphenyl-N,N-di(m-tolyl)benzidine (TPD), polyparaphenylenevinylene (PPV), polyalkylthiophene, polyvinylcarbazole (PVK), triphenylene (TNF), a liquid crystal molecule, metal phthalocyanine and 4-(dicyanomethylene)-2-methyl-6-(p-dimethylaminostyryl)-4H-pyran (DCM). These materials show high carrier mobility and, thus, are used preferably.

In the case where a polymer-based carrier transport material such as PPV or a mixture of PVK/TNF is employed, the X-ray charge conversion film is formed by dispersing particles of the X-ray sensitive material in the polymer-based carrier transport material. Alternatively, in the case where a low molecular weight carrier transport material is employed, the X-ray charge conversion film is formed by dispersing particles of the X-ray sensitive material and the low molecular weight carrier transport material in a binder. The binder used in the present invention is a polymer which includes, for example, polycarbonate and polystyrene. Where the binder is employed, the mixing ratio of the carrier transport material in the mixture of the carrier transport material and the binder is set to be about 0.1 to 40 mol %.

A coating solution is prepared by dissolving or dispersing the X-ray sensitive material and the carrier transport material, and the binder used if desired, in an organic solvent such as toluene and methylene chloride or water. The X-ray charge conversion film can be formed easily by applying the coating solution thus prepared to a substrate.

It is desirable for the equivalent thickness of the X-ray sensitive material in the X-ray charge conversion film to fall within a range of between about 1 and 10 times as much as the thickness at which the X-ray sensitive material absorbs at least about 50% of the X-ray. If the X-ray sensitive material has an equivalent thickness of this level, the X-ray charge conversion film can absorb the X-ray sufficiently. Also, it is desirable for the thickness of the X-ray charge conversion film to fall within a range of between about 1.3 and 3 times as much as the equivalent thickness noted above. In this case, a sufficient fluidity can be ensured in the step of forming the X-ray charge conversion film by means of coating.

In order to increase the mobility of the carriers generated in the X-ray charge conversion film, it is desirable to increase an electric field applied to the X-ray charge conversion film, because the mobility is usually determined by the hopping of carrier between traps in the X-ray charge conversion film. Since the applied voltage divided by the film thickness determines the electric field, it is desirable to decrease the thickness of the X-ray charge conversion film in order to increase the electric field. In this sense, it is desirable to increase the ratio of the X-ray sensitive material in the X-ray charge conversion film. Concerning the shape of the particles of the X-ray sensitive material, the packing density can be increased if the particle is close to a spherical shape, although the shape of the particles of the X-ray sensitive material is not limited to spherical. Where the particles of the X-ray sensitive material are nearly spherical, the equivalent thickness of the X-ray sensitive material can be set at about 50 to 95% of the thickness of the X-ray charge conversion film. In this case, the volume fraction of the X-ray sensitive material in the X-ray charge conversion film becomes about 30 to 90%.

In order to further increase the packing density of the X-ray sensitive material in the X-ray charge conversion film, it is possible to use both inorganic semiconductor particles having a relatively large particle size and inorganic semiconductor particles having a relatively small particle size. In this case, it is possible to use different types of inorganic semiconductors for particles having a large particle size and for particles having a small particle size.

In order to increase the conversion efficiency from the X-ray into the electric charges within the X-ray charge conversion film, it is desirable to set the density of the sensitive material relatively high on the side of the common electrode (i.e., the X-ray incident surface) and relatively low on the side of the pixel electrodes (i.e., the surface opposite to the X-ray incident surface).

In order to decrease the dark current (off current), it is desirable for the X-ray charge conversion film to have a resistivity of at least about $1 \times 10^{10}$ Ωcm. To this end, it is desirable for the mixing ratio of the carrier transport material to the binder to be made relatively high on the side of the common electrode (i.e., the X-ray incident surface) and relatively low on the side of the pixel electrodes (i.e., the surface opposite to the X-ray incident surface).

It is possible for the particles of the X-ray sensitive material to be covered with a second carrier transport material having an energy level intermediate between the energy level of the X-ray sensitive material and the energy level of the carrier transport material mixed with the binder.

It is desirable to provide a hole transport layer or p-type semiconductor between the X-ray charge conversion film and the pixel electrodes and to provide an electron transport layer or n-type semiconductor between the X-ray charge conversion film and the common electrode, when positive voltage is applied for common electrode to improve the ohmic contact and preventing dark current carrier injection from the electrode. When negative voltage is applied for common electrode, it is desirable to provide an electron transport layer or n-type semiconductor between the X-ray charge conversion film and the pixel electrodes and to provide a hole transport layer or p-type semiconductor between the X-ray charge conversion film and the common electrode. It is desirable for each of the hole mobility in the hole transport layer and the electron mobility in the electron transport layer to be at least about $1 \times 10^{-7}$ cm$^2$/V·sec.

The electron transport layer is formed of at; least one material selected from the group consisting of an oxadiazole derivative, Alq$_3$, and n-type semiconductor such as n-type Si and n-type GaAs. The hole transport layer is formed of at least one material selected from the group consisting of TPD, diamine, PPV, DCM, and p-type semiconductor such as p-type Si and p-type GaAs.

Some embodiments of the present invention will now be described in detail. Of course, the technical scope of the present invention is not limited by these embodiments.

Figure 2:
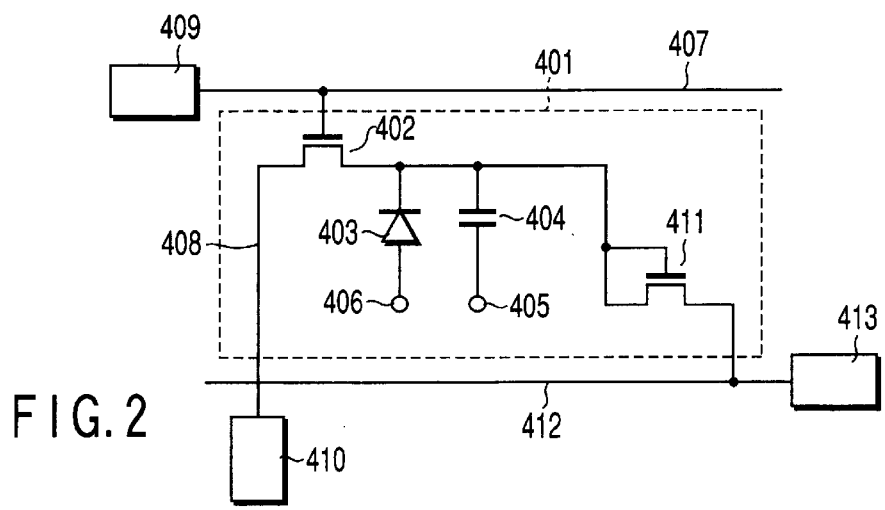
FIG. 2 is a circuit diagram showing a planar X-ray detector according to the embodiment of the present invention.

First, a circuit construction of one pixel of a planar X-ray detector according to one embodiment of the present invention will be described with reference to FIG. 2. A switching element (switching TFT) 402, an X-ray charge conversion film 403, a capacitor (Cst) 404, and a protective TFT (or diode) 411 are included in a single pixel 401. The pixels 401 are arranged to form an array. A negative bias voltage is applied from a high voltage power source 406 to the X-ray charge conversion film 403. The Cst 404 is connected to the Cst bias line 405. The switching TFT 402 is connected to each of a scanning line 407 and a signal line 408 and is subjected to on/off control by a scanning line driving circuit 409. The terminal of the signal line 408 is connected to an amplifier 410 for the signal detection. The protective TFT 411 is biased by a power source 413 via a bias line 412. Incidentally, it is possible to utilize the floating capacitance of another element or a wire in place of the Cst 404.

The planar X-ray detector is operated as follows. If an X-ray is incident on the detector, the X-ray is converted into electric charges by the X-ray charge conversion film 403 and the electric charges are stored in the Cst 404. If the scanning line 407 is driven by the scanning line driving circuit 409 so as to turn on a raw of switching TFTs 402 connected to a single scanning line 407, the accumulated charges are transmitted through the signal line 408 connected to a column of switching TFTs 402 toward the amplifier 410. Then, amplified charges for each pixel from the amplifier 410 can be displayed on, for example, a CRT. The charge amount differs depending on the intensity of X-ray irradiated into the pixel 401. Incidentally, in order to prevent excessive charges from being accumulated in the Cst 404, charges that exceed the bias voltage of the bias line 412 are released through the protective TFT 411 to the bias line 412.

(First Embodiment)

Figure 3:
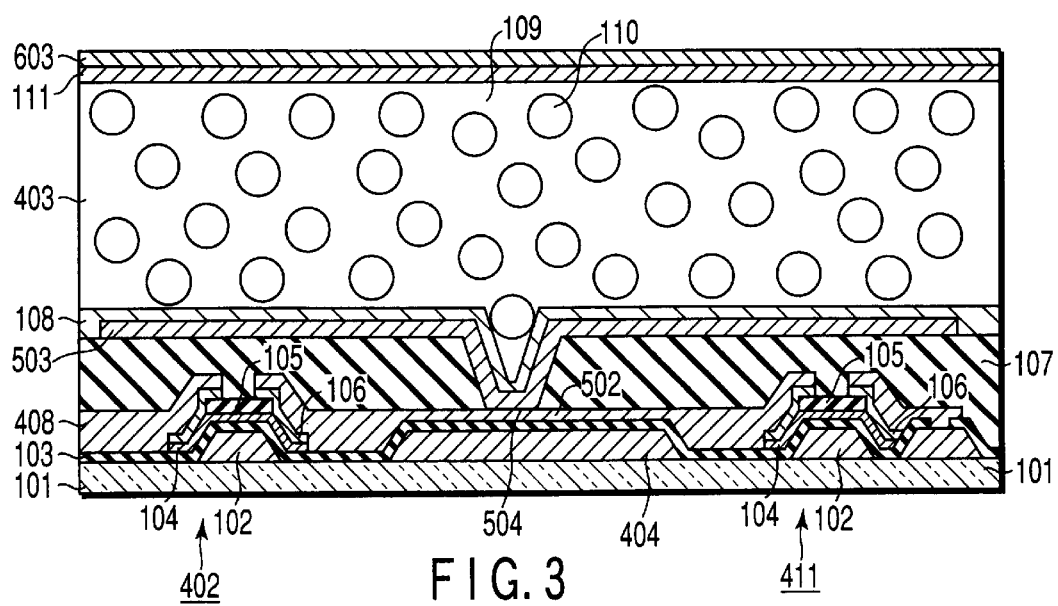
FIG. 3 is a cross sectional view showing a planar X-ray detector according to the embodiment of the present invention.
Figure 4A:
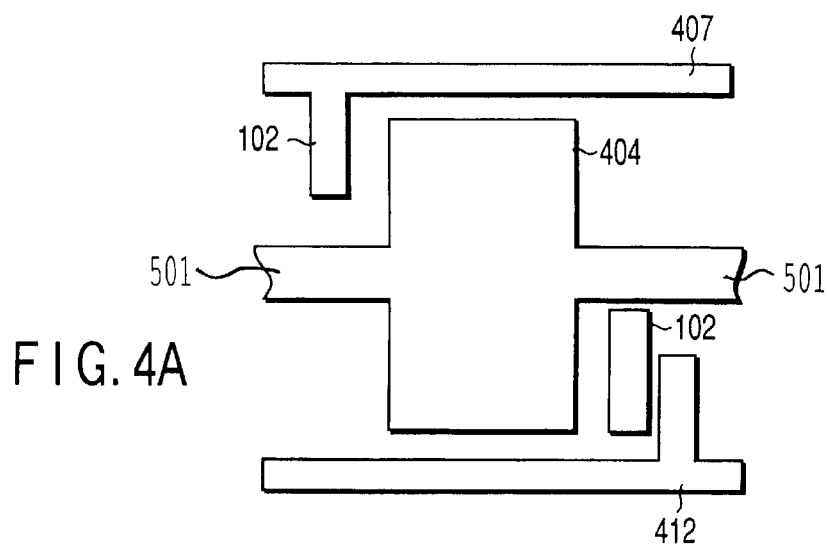
FIGS. 4A to 4C are plan views showing the manufacturing process of a planar X-ray detector according to the embodiment of the present invention.
Figure 4B:
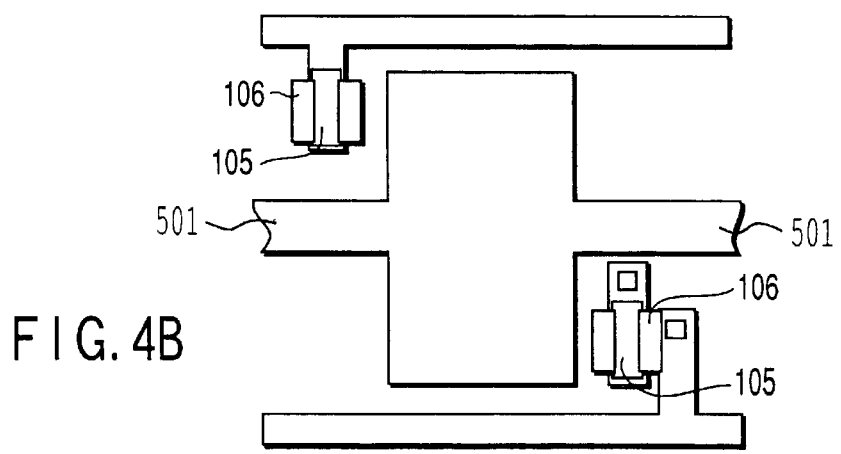
Figure 4C:
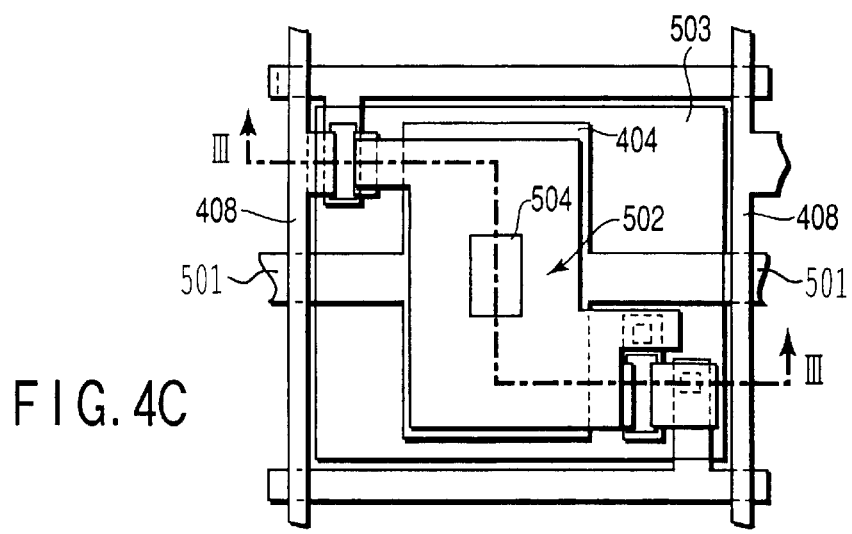

A first embodiment of the present invention will now be described. FIG. 3 shows a cross sectional view and FIGS. 4A to 4C show plan views of a planar X-ray detector according to the first embodiment of the present invention. FIG. 3 is a cross sectional view along the line III—III shown in FIG. 4C. Note that FIG. 4C shows only members positioned lower than the pixel electrodes. The method of manufacturing the planar X-ray detector according to the first embodiment of the present invention will be described first with reference to these drawings.

A gate electrode 102 of the switching TFT 402 and the scanning line 407, a gate electrode 102 of the protective TFT 411, the capacitor electrode 404 and the Cst line 501 are formed made of a metal film deposited in a thickness of about 300 nm on a glass substrate 101. It is possible for the metal film to be of a single layer structure consisting of MoTa, Ta, TaN, Al, an Al alloy, Cu or MoW or to be of a two-layered structure consisting of laminated Ta and TaNx or laminated Mo and Al alloy. The metal film is processed by photo-lithography so as to form a pattern of a gate electrode 102 of the switching TFT 402 and the scanning line 407, a gate electrode 102 of the protective TFT 411, the capacitor electrode 404 and the Cst line 501, and the bias line 412, as shown in FIG. 4A.

Then, an insulating film 103 is formed by a SiOx layer having a thickness of about 300 nm and a SiNx layer having a thickness of about 50 nm. The SiOx layer and the SiNx layer are successively formed on the entire surface by plasma CVD, followed by depositing an undoped amorphous silicon layer 104 in a thickness of about 100 nm on the entire surface of the insulating film 103. Then, a stopper 105 is formed by depositing a SiNx layer in a thickness of about 200 nm on the entire surface of the undoped amorphous silicon layer 104. The SiNx layer is patterned to conform to a gate by a back surface exposure method so as to form the stopper 105. Then, an n$^+$ amorphous silicon layer 106 is deposited on the entire surface. Further, the n$^+$ amorphous silicon layer 106 and the undoped amorphous silicon layer 104 are processed by photolithography so as to form the source and drain regions of each of the switching TFT 402 and the protective TFT 411. Then, the amorphous layer and the insulating layer 103 on the gate electrode 102 of the protective TFT 411 and the bias line 412 are partly removed so as to form contact holes, as shown in FIG. 4B.

Further, the auxiliary electrode 502, the signal line 408 and the wires such as source and drain electrodes for the TFTs are formed by a Mo layer having a thickness of about 50 nm, an Al layer having a thickness of about 350 nm and a Mo layer having a thickness of about 20 to 50 nm. The Mo layer, Al layer and Mo layer are successively deposited on the entire surface by sputtering. These metal layers are processed by photolithography as shown in FIG. 4C.

Then, the passivation film 107 is formed on the entire surface by laminating a SiNx layer having a thickness of about 200 nm and a benzocyclobutene (BCB) layer having a thickness of about 1 to 5 μm, preferably, about 3 μm. The passivation film 107 positioned on the auxiliary electrode 502 is partly removed by photo-lithography so as to form a contact hole 504. Then, the pixel electrode 503 is formed by an ITO layer deposited on the entire surface in a thickness of about 100 nm, followed by patterning the ITO layer in a size of the pixel. Further, the hole transport layer 108 is formed by a TPD layer applied to the entire surface in a thickness of about 10 nm to 100 nm.

Further, an X-ray charge conversion layer 403 having a thickness of about 10 $\mu$m to 1000 $\mu$m, preferably about 200 $\mu$m, is formed on the entire surface of the hole transport layer 108. The X-ray charge conversion film 403 is formed by applying a mixture prepared by dispersing a carrier transport material 109 made of TPD and an X-ray sensitive material 110 made of $PbI_2$ fine particles having a particle size of about 1 to 10 $\mu$m in a binder made of a polycarbonate resin.

Further, an electron transport layer 111 having a thickness of about 10 nm to 100 $\mu$m is formed on the entire surface of the X-ray charge conversion film 403 by applying an oxadiazole derivative, followed by forming the common electrode 603 having a thickness of about 100 nm on the entire surface of the electron transport layer 111 by depositing Al or MgAg. Finally, the wires are connected to the driving circuit 409 and so on.

As described above, the X-ray charge conversion film 403 in the planar X-ray detector of the embodiment can be formed by printing or spin coating a mixture of the X-ray sensitive material 110, the carrier transport material 109 and the binder, making it possible to simplify the manufacturing process and lower the manufacturing cost compared to conventional vacuum evaporation film deposition. In addition, it is easy to enlarge the detector. In the X-ray charge conversion film 403, the X-ray sensitive material 110 that may possibly give a detrimental effect to the human body is covered with the mixture of the carrier transport material 109 and the binder and, thus, is scarcely exposed to the outside, leading to a high safety to the human body.

It should also be noted that the hole transport layer 108 is interposed between the X-ray charge conversion film 403 and the pixel electrode 503, and the electron transport layer 111 is interposed between the X-ray charge conversion film 403 and the common electrode 603, with the result that decreases a dark current without deteriorating carrier collecting efficiency, and increases SN ratio of the X-ray detector. If p-type Si fine particles or p-type GaAs fine particles are added to the hole transport layer 108, and if n-type Si fine particles or n-type GaAs fine particles are added to the electron transport layer 108, the carrier mobility is increased so as to further increase the carrier collecting efficiency.

Figure 5:
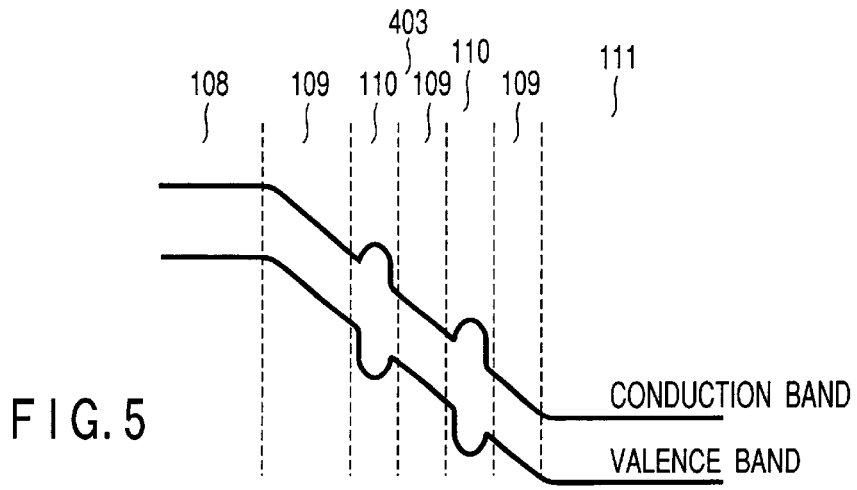
FIG. 5 shows a band diagram of an X-ray charge conversion film of the planar X-ray detector shown in FIG. 3.

FIG. 5 shows a band diagram of the X-ray sensitive material 110 and the carrier transport material 109 contained in the X-ray charge conversion film 403. In order to efficiently take out the charges generated within the X-ray charge conversion film 403 upon irradiation with an X-ray to the outside, it is desirable to use the X-ray sensitive material 110 and the carrier transport material 109 satisfying the relationship shown in FIG. 5, though it is not absolutely necessary for these materials to satisfy the relationship. To be more specific, it is advantageous in taking out the electrons that, at the conduction band edge, the energy level Ec(PC) of the X-ray sensitive material 110 is higher than the energy level (also referred to as the lowest unoccupied molecular orbital, or LUMO) Ec(O) of the carrier transport material 109. On the contrary, it is advantageous in taking out the holes that, at the valence band edge, the energy level Ev(PC) of the X-ray sensitive material 110 is lower than the energy level (also referred to as the highest occupied molecular orbital, or HOMO) Ev(O) of the carrier transport material 109.

To be more specific, if the vacuum level Ic is used as a reference to compare the energy level at the conduction band edge, the electrons can be taken out advantageously in the case where the value of Ic–Ec(PC) is smaller than the value of Ic–EC(O). Also, if the vacuum level Ic is used as a reference to compare the energy level at the valence band edge, the holes can be taken out advantageously in the case where the value of Ic–Ec(PC) is larger than the value of Ic–EC(O). Table 1 shows the values of energy gap Eg (=Ec–Ev), Ic–Ec (or LUMO) and Ic–Ev (or HOMO) in respect of various X-ray sensitive materials and carrier transport materials. Incidentally, these values do not determined for some materials.

TABLE 1

|  | Eg = Ec-Ev [eV] | Ic-Ec (LUMO) [eV] | Ic-Ec (HOMO) [eV] |
|---|---|---|---|
| $PbI_2$ | 2.35 | 3.15 | 5.50 |
| Se | 2.3 | 2.32 | 4.62 |
| $HgI_2$ | 2.13 | | |
|  | 2.52 | 6.10 | 8.62 |
| $SnSe_2$ | 1 | | 5.35 |
| $SnS_2$ | 2.1 | | 6.3 |
| Perylene | 3.1 | 2.55 | 5.65 |
| Pentacene | 2.2 | 2.87 | 5.07 |
| Tetracene | 2.93 | 2.47 | 5.4 |
| BPZ | 3.30 | 3.10 | 6.40 |
| 5,6,11,12-Tetraphenyl-naphthacene | 2.21 | 3.15 | 5.36 |
| αNPD | 2.3 | 3.1 | 5.4 |
| DCM | 2.2 | 3.2 | 5.4 |
| $Alq_3$ | 2.8 | 2.6 | 5.4 |
| PPV | 2.4 | 2.7 | 5.1 |
| Quinacridone | 2.29 | 3.27 | 5.56 |
| Bu-PPyV | 2.45 | 2.93 | 5.38 |
| DMeOPPV | 2 | 2.7 | 4.7 |
| PBD | 3.6 | 2.46 | 6.06 |
| Eu complex | 3 | 3.5 | 6.5 |

5,6,11,12-Tetraphenylnaphthacene, CAS No. 517-511-1;

DCM is 4-(dicyanomethylene)-2-methyl-6-(p-dimethylaminostyryl)-4H-pyran, CAS No. 51325-91-8;

$Alq_3$ is tris(8-hydroxyquinolinolato) aluminum (III), CAS No. 2085-33-8;

PPV is poly(paraphanylenevinylene), CAS No. 52547-07-6;

DMeOPPV is poly(dimethoxyphenylene vinylene);

Eu complex is 1,10-phenanthroline tris-4,4,4,-trifluoro-1-2-thienyl butane-1,3-dionate europium.

αNPD is represented by the following chemical formula:

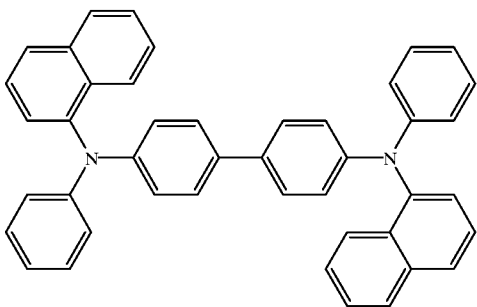

As apparent from Table 1, in the case where used is PbI$_2$, as the X-ray sensitive material, having high conversion efficiency from X-ray into electric charges, it is desirable to use the carrier transport materials described below. Specifically, the carrier transport materials advantageous for transporting electrons include, for example, 5,6,11,12-tetraphenylnaphthacene, DCM, quinacridone and Eu complex, which have a value of Ic–Ec (or LUMO) larger than that of PbI$_2$, i.e., about 3.15 eV. The carrier transport materials advantageous for transporting the holes include, for example, pentacene, tetracene, 5,6,11,12-tetraphenylnaphthacene, αNPD, Alq$_3$, DCM, PPV, Bu-PPyV and DMeOPPV, which have a value of Ic–Ev (or HOMO) smaller than that of PbI$_2$, i.e., about 5.5 eV. It is particularly desirable to use 5,6,11,12-tetraphenylnaphthacene and DCM that satisfies the both conditions.

It is possible to select the carrier transport materials on the basis described above in also the case where a material other than PbI$_2$ is used as the X-ray sensitive material. For example, the carrier transport materials that can be used in combination with PbI$_2$ can also be used in combination with HgI$_2$.

In general, a suitable carrier transport material is selected from carrier transport materials having LUMO of about 2.4 eV or more and HOMO of about 6.5 eV or less, depending on the X-ray sensitive material.

(Second Embodiment)

Figure 6:
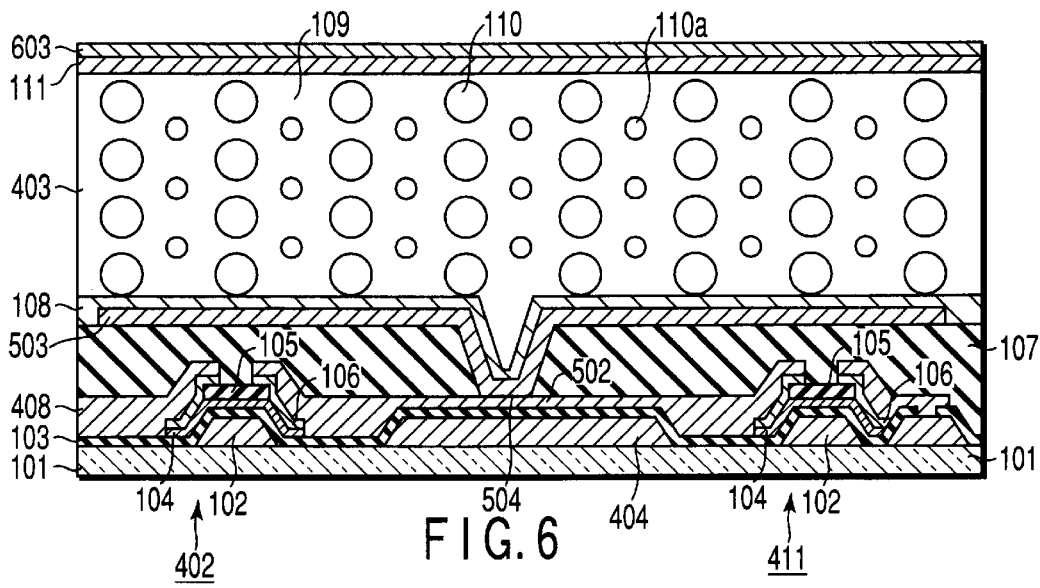
FIG. 6 is a cross sectional view showing a planar X-ray detector according to another embodiment of the present invention.

The second embodiment of the present invention will now be described with reference to FIG. 6. In this embodiment, X-ray sensitive material particles 110a having a relatively small particle size are mixed with the X-ray sensitive material particles 110 having a relatively large particle size used in FIG. 3, which are used as the X-ray sensitive material forming the X-ray charge conversion film 403. By using the large particles and small particles together, it is possible to further increase the packing density of the X-ray sensitive material in the X-ray charge conversion film 403, which improves X-ray absorption efficiency, making it possible to decrease the thickness of the X-ray charge conversion film 403. As a result, it is possible to increase the carrier mobility within the X-ray charge conversion film 403 and, thus, to take out the carriers to the outside efficiently. It is desirable for the particle size of the small particle to be about 0.1 to 0.3 times as small as the particle size of the large particle, since higher packing density is obtained.

It is possible to change the kinds of the X-ray sensitive material formed of large particles and the X-ray sensitive material formed of small particles depending on the purpose. For example, it is possible to prepare an X-ray sensitive film having a high mechanical strength and a high conversion efficiency by mixing, for example, CdTe exhibiting high mechanical strength and high carrier mobility with PbI$_2$ exhibiting a high absorption coefficient and a high charge conversion efficiency.

(Third Embodiment)

A third embodiment of the present invention will now be described with reference to FIGS. 7 and 8. As described above, it is desirable for the band diagram of the hole transport layer 108, the X-ray charge conversion film 403 and the electron transport layer 11 to meet the relationship shown in FIG. 5. However, the relationship shown in FIG. 5 is not necessarily satisfied depending on the X-ray sensitive material 110 and the carrier transport material 109 used in the X-ray charge conversion film 403. Depending on the combination of the materials, it is possible for the energy level Ec(PC) of the X-ray sensitive material 110 to be lower than the energy level Ec(O) of the carrier transport material 109 at the conduction band edge as well as it is possible for the energy level Ev(PC) of the X-ray sensitive material 110 to be higher than the energy level Ev(O) of the carrier transport material 109 at the valence band edge. In this case, an energy barrier for carriers is formed between the X-ray sensitive material 110 and the carrier transport material 109. As a result, it is highly probable for the electrons to be locally confined in the X-ray sensitive material 110 so as to be recombined with the holes within the X-ray sensitive material 110, resulting in loss of the carriers. It follows that the probability is lowered that the electrons generated within the X-ray sensitive material 110 are taken into the carrier transport material 109.

Figure 7:
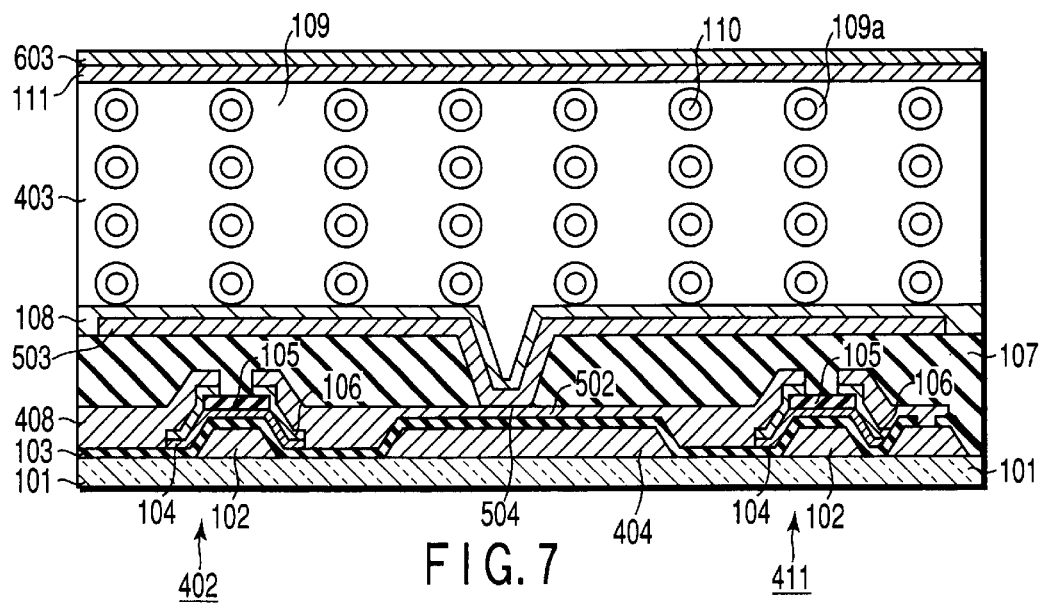
FIG. 7 is a cross sectional view showing a planar X-ray detector according to still another embodiment of the present invention.

In the embodiment shown in FIG. 7, the X-ray sensitive material 110 constituting the X-ray charge conversion film 403 is covered with a second transport material 109a made of an organic semiconductor. The energy level of the second transport material 109a is intermediate between the energy level of the X-ray sensitive material 110 and the energy level of the carrier transport material 109 mixed with the binder.

Figure 8:
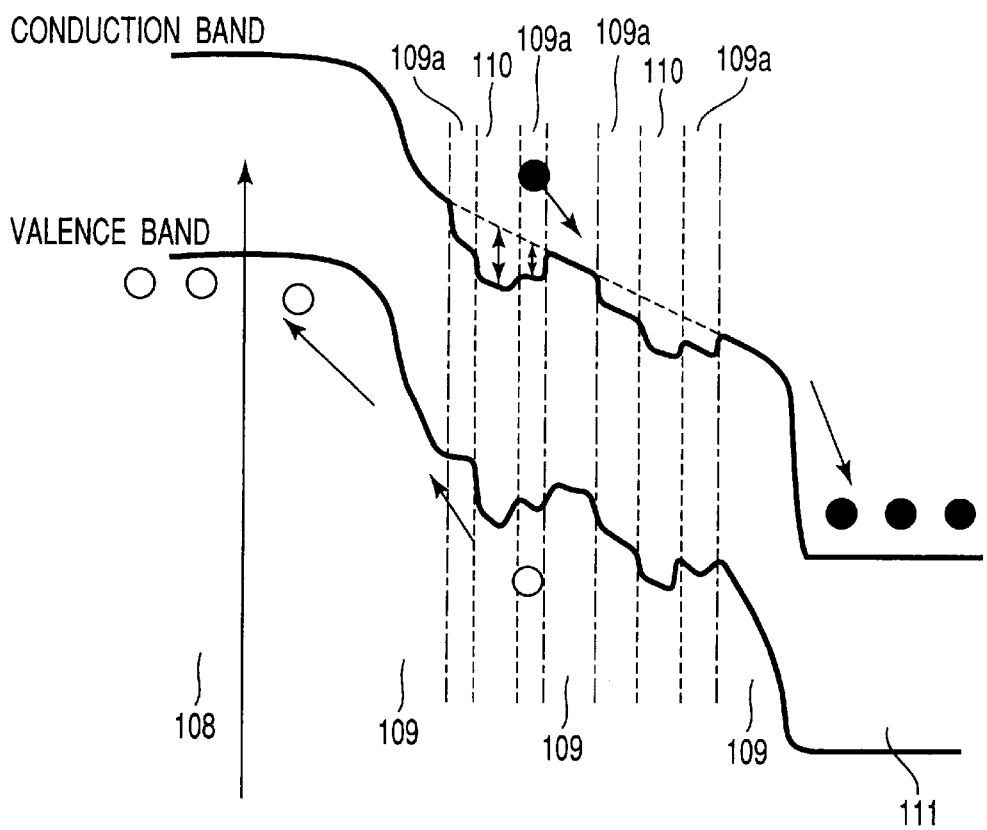
FIG. 8 shows a band diagram of a hole transport layer, the X-ray charge conversion film and the electron transport layer of the planar X-ray detector shown in FIG. 7.

FIG. 8 shows the band diagram of the X-ray sensitive material 110, the second carrier transport material 109a and the carrier transport material 109 contained in the X-ray charge conversion film 403. As shown in the drawing, the energy level of the second transport material 109a is intermediate between the energy level of the X-ray sensitive material 110 and the energy level of the carrier transport material 109 and, thus, the energy barrier is lowered. Therefore, the electrons generated in the X-ray sensitive material 110 are transported through the second carrier transport material 109a into the carrier transport material 109 within the binder so as to further increase the probability of transport to the outside. Since the electrons released to the outside of the X-ray sensitive material 110 are separated in larger spacial distance from the holes, the probability of recombination of the electrons and holes is lowered. The carriers finally drifted to the pixel electrode contribute to the signals, with the result that the proportion of the carriers contributing to the signals is increased.

(Fourth Embodiment)

Figure 9:
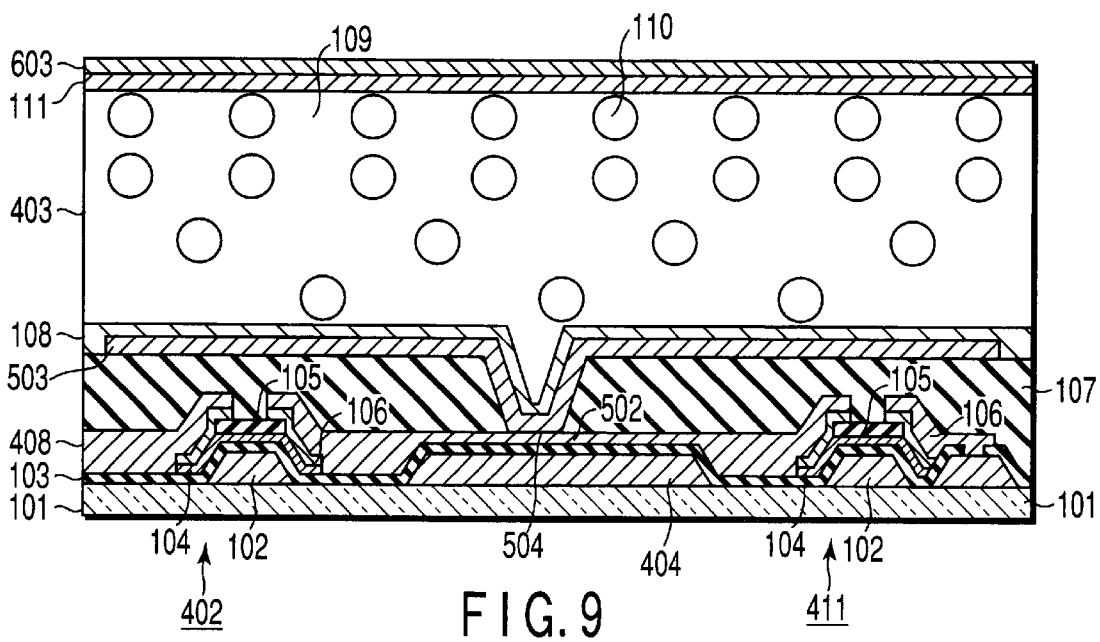
FIG. 9 is a cross sectional view showing a planar X-ray detector according to still another embodiment of the present invention.

A fourth embodiment of the present invention will now be described with reference to FIG. 9. In the X-ray charge conversion film 403 shown in FIG. 9, the density of the X-ray sensitive material 110 is relatively high on the side of the surface common electrode 603 (the X-ray incident surface) and is gradually lowered relatively toward the inner region (on the side of the surface opposite to the X-ray incident surface). The most portion of the X-ray is absorbed on the surface such that the intensity of the X-ray is exponentially decreased from the surface toward the inner region. Therefore, if the density of the X-ray sensitive material 110 is set high on the side of the surface as shown in FIG. 9, it is possible to increase the conversion efficiency from the X-ray into the electric charges.

On the other hand, since the X-ray detected by the planar X-ray detector is weak, it is necessary to make the dark current (off current) sufficiently low in order to improve the SN ratio. To be more specific, in a pixel of 150 $\mu$m×150 $\mu$m, a low current of about $1\times10^{-14}$ A is required under an electric field of about 10 V/$\mu$m. Therefore, it is desirable to set the resistivity of the X-ray charge conversion film 403 at a sufficiently high level. An organic carrier transport material has high resistivity of about $1\times10^{12}$ to $1\times10^{14}$ $\Omega$cm, but an X-ray sensitive material has relatively low resistivity of about $1\times10^{10}$ $\Omega$cm or smaller. Therefore, if the thickness of the X-ray charge conversion film 403 is decreased in an attempt to increase the carrier mobility, it is possible to fail to obtain sufficient resistance.

Even where the thickness of the X-ray charge conversion film 403 is small, it is effective to make the mixing ratio of the carrier transport material 109 within the binder lower on the side of the pixel electrode 503 (the surface opposite to the X-ray incident surface) than on the side of the surface common electrode 603 (the X-ray incident surface) so as to increase the resistance. It is effective to set the mixing ratio of the transport material 109 within the binder on the side of the pixel electrode 503 at a value about 1/10 the mixing ratio on the side of the common electrode 603.

It is possible to lower the density of the X-ray sensitive material and to lower the mixing ratio of the carrier transport material, on the side of the pixel electrode 503, simultaneously. Alternatively, it is possible to perform any one of the lowering of the density of the X-ray sensitive material and the lowering of the mixing ratio of the carrier transport material. Also, it suffices to apply such adjustment to a region of 1/3 to 1/20 of the thickness of the X-ray charge conversion film 403 as measured from the side of the pixel electrode 503.

In the embodiment, the substrate is not particularly limited as far as it is possible to form a TFT thereon. Also, it is possible to form the X-ray charge conversion film by coating with a solution at a low temperature. It follows that it is possible to use for a substrate a plastic material having a low heat resistance, and thus to make the planar X-ray detector as a whole flexible.

In each of the embodiments described above, amorphous silicon is used as silicon for forming a TFT. Alternatively, it is also possible to use polysilicon. Since the mobility of the carriers is high within polysilicon, it is possible to diminish the TFT size and enlarge the effective area of the pixel. Also, in the case of using polysilicon, the peripheral circuits can also be formed on the same substrate so as to lower the manufacturing cost of the apparatus including the peripheral circuits. It is possible for the TFT to be formed such that the gate is positioned on the upper surface (top gate structure) or lower surface (bottom gate structure).

It is possible for the passivation film 107 to be formed of, for example, SiNx, SiO$_2$, polyimide having $\epsilon$ of about 3.3 and a breakdown voltage of about 300 V/mm, benzocyclobutene having $\epsilon$ of about 2.7 and a breakdown voltage of about 400 V/mm, an acrylic photosensitive resin (trade name HRC available from Japan Synthetic Rubber K.K.) having $\epsilon$ of about 3.2, and a black resist. If desired, these films may be laminated. It is also effective to use a fluorine-containing resin having a low relative dielectric constant ($\epsilon$=about 2.1) for forming the passivation film 107. It is desirable for the passivation film 107 to be photosensitive because the patterning can be facilitated. However, it is not absolutely necessary for the passivation film 107 to be photosensitive.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A planar X-ray detector, comprising:
   an X-ray charge conversion film converting an incident X-ray into electric charges;
   pixel electrodes provided under the X-ray charge conversion film corresponding to respective pixels arranged in an array;
   switching elements connected to the respective pixel electrodes;
   signal lines, each of which is connected to a column of switching elements;
   scanning lines, each of which transmits driving signals to a row of switching elements; and
   a common electrode provided on the surface of the X-ray charge conversion film opposite to the surface on which the pixel electrodes are provided;
   wherein the X-ray charge conversion film contains an X-ray sensitive material comprising inorganic semiconductor particles having two different particle sizes, and a carrier transport material comprising an organic semiconductor.

2. The planar X-ray detector according to claim 1, wherein the X-ray sensitive material is made of at least one material selected from the group consisting of PbI$_2$, CsI, NaI, HgI$_2$, CdS, Hg$_2$IN, HgBrN, Mn$_3$HgN, HgI$_2$BN, PbN$_2$, Pb(N$_3$)$_2$, GaAs, CdTe, PbTe, Te and Se.

3. A planar X-ray detector, comprising:
   an X-ray charge conversion film converting an incident X-ray into electric charges;
   pixel electrodes provided under the X-ray charge conversion film corresponding to respective pixels arranged in an array;
   switching elements connected to the respective pixel electrodes;
   signal lines, each of which is connected to a column of switching elements;
   scanning lines, each of which transmits driving signals to a row of switching elements; and
   a common electrode provided on the surface of the X-ray charge conversion film opposite to the surface on which the pixel electrodes are provided;
   wherein the X-ray charge conversion film contains an X-ray sensitive material comprising inorganic semiconductor particles, and a carrier transport material comprising an organic semiconductor, a density of the X-ray sensitive material in the X-ray charge conversion film being relatively high on a side of the common electrode and relatively low on a side of the pixel electrodes.

4. A planar X-ray detector, comprising:
   an X-ray charge conversion film converting an incident X-ray into electric charges;
   pixel electrodes provided under the X-ray charge conversion film corresponding to respective pixels arranged in an array;
   switching elements connected to the respective pixel electrodes;

signal lines, each of which is connected to a column of switching elements;

scanning lines, each of which transmits driving signals to a row of switching elements; and a common electrode provided on the surface of the X-ray charge conversion film opposite to the surface on which the pixel electrodes are provided;

wherein the X-ray charge conversion film contains an X-ray sensitive material, a carrier transport material comprising an organic semiconductor and a binder, a mixing ratio of the carrier transport material to the binder being relatively high on a side of the common electrode and relatively low on a side of the pixel electrodes.

5. A planar X-ray detector, comprising:

an X-ray charge conversion film converting an incident X-ray into electric charges;

pixel electrodes provided under the X-ray charge conversion film corresponding to respective pixels arranged in an array;

switching elements connected to the respective pixel electrodes;

signal lines, each of which is connected to a column of switching elements;

scanning lines, each of which transmits driving signals to a row of switching elements; and a common electrode provided on the surface of the X-ray charge conversion film opposite to the surface on which the pixel electrodes are provided;

wherein the X-ray charge conversion film contains an X-ray sensitive material, a carrier transport material comprising an organic semiconductor and a binder, the particles of the X-ray sensitive material being covered with a second carrier transport material including an organic semiconductor, an energy level of which the second carrier transport material is intermediate between an energy level of the X-ray sensitive material and an energy level of the carrier transport material mixed with the binder.

6. A planar X-ray detector comprising:

a pair of electrodes, and an X-ray charge conversion film disposed between the electrodes, the film containing a mixture of inorganic semiconductor particles sensitive to an X-ray and having two different particle sizes and a carrier transport material.

7. The planar X-ray detector according to claim 6, wherein the inorganic semiconductor particles are made of at least one material selected from the group consisting of $PbI_2$, CsI, NaI, $HgI_2$, CdS, $Hg_2IN$, HgBrN, $Mn_3HgN$, $HgI_2BN$, $PbN_2$, $Pb(N_3)_2$, GaAs, CdTe, PbTe, Te and Se.

8. A planar X-ray detector comprising:

a pair of electrodes, and an X-ray charge conversion film disposed between the electrodes, the film containing a mixture of inorganic semiconductor particles sensitive to an X-ray and a carrier transport material, wherein a density of the X-ray sensitive material in the X-ray charge conversion film being relatively high on a side of one of the electrodes and relatively low on a side of the other one of the electrodes.

9. A planar X-ray detector comprising:

a pair of electrodes, and an X-ray charge conversion film disposed between the electrodes, the film containing a mixture of inorganic semiconductor particles sensitive to an X-ray and a carrier transport material, wherein a mixing ratio of the carrier transport material to the binder is relatively high on a side of one of the electrodes and relatively low on a side of the other one of the electrodes.

10. A planar X-ray detector comprising:

a pair of electrodes, and an X-ray charge conversion film disposed between the electrodes, the film containing a mixture of inorganic semiconductor particles sensitive to an X-ray and a carrier transport material, wherein the particles of the X-ray sensitive material are covered with a second carrier transport material including an organic semiconductor, an energy level of which the second carrier transport material is intermediate between an energy level of the X-ray sensitive material and an energy level of the carrier transport material mixed with the binder.

11. A planar X-ray detector, comprising:

an X-ray charge conversion film converting an incident X-ray into electric charges;

pixel electrodes provided under the X-ray charge conversion film corresponding to respective pixels arranged in an array;

switching elements connected to the respective pixel electrodes;

signal lines, each of which is connected to a column of switching elements;

scanning lines, each of which transmits driving signals to a row of switching elements; and a common electrode provided on the surface of the X-ray charge conversion film opposite to the surface on which the pixel electrodes are provided, wherein the X-ray charge conversion film contains an X-ray sensitive material comprising inorganic semiconductor particles, and wherein an equivalent thickness of the X-ray sensitive material in the X-ray charge conversion film falls within a range of between 1 and 10 times as much as the thickness at which the X-ray sensitive material absorbs 50% of the X-ray.

12. The planar X-ray detector according to claim 11, wherein the equivalent thickness of the X-ray sensitive material in the X-ray charge conversion film falls within a range of between 1.3 and 3 times as much as the thickness at which the X-ray sensitive material absorbs 50% of the X-ray.

* * * * *